United States Patent
Miyamoto et al.

(10) Patent No.: US 6,570,643 B1
(45) Date of Patent: May 27, 2003

(54) SEMICONDUCTOR DEVICE, MANUFACTURING METHOD THEREOF AND SEMICONDUCTOR MANUFACTURING SYSTEM

(75) Inventors: Yuki Miyamoto, Hyogo (JP); Yasuhiro Sato, Hyogo (JP); Hajime Matsumoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/624,598

(22) Filed: Jul. 25, 2000

(30) Foreign Application Priority Data

Jan. 28, 2000 (JP) ........................ 2000-019672

(51) Int. Cl.[7] ................. G03B 27/72; G03B 27/52; G03B 27/42
(52) U.S. Cl. ................. 355/69; 355/55; 355/53
(58) Field of Search ................. 355/52, 53, 55, 355/69–71; 356/399–401; 250/492.2, 492.22; 430/5, 30, 311

(56) References Cited

U.S. PATENT DOCUMENTS 5,808,312 A * 9/1998 Fukuda ................. 250/492.2
5,815,685 A * 9/1998 Kamon ................. 395/500
5,835,227 A * 11/1998 Grodnensky et al. ........ 356/399
5,935,744 A * 8/1999 Nakajima ................. 430/30
5,965,308 A   10/1999 Ozawa ..................... 430/30
6,294,297 B1 * 9/2001 Mimotogi ................. 430/30
6,334,209 B1 * 12/2001 Hashimoto ................. 716/21

FOREIGN PATENT DOCUMENTS

| JP | 5-13292 | 1/1993 |
| JP | 6-163378 | 6/1994 |
| JP | 8-130180 | 5/1996 |
| JP | 10022205 | 1/1998 |
| JP | 10112425 | 4/1998 |
| TW | 368382 | 9/1999 |

* cited by examiner

*Primary Examiner*—Henry Hung Nguyen
(74) *Attorney, Agent, or Firm*—McDermott, Will & Emery (57) ABSTRACT

A semiconductor manufacturing system and method includes an exposure value detector for detecting an exposure value, a pattern size detector for detecting a pattern size, a size comparator for calculating a size difference between the pattern size and a target value, an optimum exposure value calculator for calculating an optimum exposure value based on the exposure value and the size difference, an exposure value controller. In this semiconductor device manufacturing method, the optimum exposure value is calculated based on the exposure value and the size difference, and exposure is performed at the optimum exposure value. A semiconductor device is manufactured by the manufacturing method.

7 Claims, 5 Drawing Sheets

SEMICONDUCTOR DEVICE, MANUFACTURING METHOD THEREOF AND SEMICONDUCTOR MANUFACTURING SYSTEM

BACKGROUND OF THE INVENTION

1. Field of the Invention

The present invention relates to a semiconductor device manufacturing method of calculating an optimum exposure value from the size of a photolithographed pattern in a transfer process for semiconductor manufacturing, and controlling the exposure value by feeding back the calculated value. The present invention also relates to a system for implementing the manufacturing method, and a semiconductor device manufactured by the manufacturing method.

2. Description of the Background Art

In general, a photolithographic process is intended to apply a photosensitive material to a wafer, expose the photosensitive material by an exposure device for development, and thereby form a pattern. Thereafter, the size of the formed pattern is measured. For the size measurement, a target value and a standard value are set, and the finished pattern is considered to be better as the size measurement result is closer to the target value.

In the conventional photolithographic process as described above, the exposure step is carried out by first setting an exposure value and maintaining the exposure value to be constant. However, an optimum exposure value for performing a patterning step in the photolithographic process is varied by various factors such as change in the underlying layer or fluctuation in the exposure device. If the exposure value is controlled to be constant, therefore, the set exposure value may deviate from the optimum exposure value due to change in the underlying layer, for example. In this case, the size measurement result of the developed pattern deviates from the target value.

In order to solve this problem, an operator may change the exposure value by resetting the optimum exposure value when the size measurement result deviates from the target value. In this case, however, the conditions need to be reset and a delay is caused until the optimum exposure value is reflected.

SUMMARY OF THE INVENTION

The present invention was made to solve the above described problems. An object of the present invention is to easily correct an exposure value to an optimum exposure value at an early stage even if change in the underlying layer, fluctuation in the exposure device or the like is caused, by performing the exposure operation at an optimum exposure value which is calculated automatically by utilizing a size measurement result.

A semiconductor manufacturing system according to the present invention includes exposure value detection means for detecting the exposure value of an exposure device, pattern size detection means for detecting the size of a pattern formed after photolithography, size comparison means for comparing the pattern size detected by the pattern size detection means and a target value to calculate a size difference, optimum exposure value calculation means for calculating an optimum exposure value by using the size difference and the exposure value, and exposure value control means for controlling the exposure value of the exposure device so as to be the optimum exposure value calculated by the optimum exposure value calculation means.

By providing the exposure value detection means and the pattern size detection means as described above, the exposure value of the exposure device and the size of the pattern formed after photolithography can be detected. By providing the size comparison means, the size difference between the pattern size and the target value can be calculated. By using the size difference and the exposure value, the optimum exposure value calculation means can automatically calculate the optimum exposure value. The exposure value control means can control the exposure value of the exposure device so as to be the optimum exposure value calculated as described above. Even if change in the underlying layer, fluctuation in the exposure device or the like is caused, an exposure operation at an optimum exposure value can be performed by changing the exposure value at an early stage and in a simple manner. Specifically, wafers of the next lot can be exposed at the optimum exposure value.

The above described exposure value calculation means may calculate the optimum exposure value by adding a product of a conversion coefficient for the pattern by the size difference to an actual exposure value. In this specification, the conversion coefficient is a coefficient for converting a size to an exposure value, and a variable exposure value can be calculated by multiplying a conversion coefficient by a variable size.

For example, the above described conversion coefficient can be found for each pattern based on a correlation of the size difference with a difference between the optimum exposure value and the actual exposure value. By multiplying the conversion coefficient by the size difference, it is possible to obtain the difference between the actual exposure value and the optimum exposure value. By adding the difference to the actual exposure value, the optimum exposure value can be calculated.

When a plurality of patterns are formed, the optimum exposure value calculation means calculates a product of the conversion coefficient and the size difference for each pattern. The optimum exposure value calculation means has at least one operation means selected from the group of first operation means for finding an average value of the product values for the patterns, second operation means for selecting a central value of the product values for the patterns when the products are arranged in order of magnitude, and third operation means for multiplying the product values for the patterns by coefficients according to the patterns, adding them together and dividing the result by a sum of the coefficients.

The first operation means can control the size of each pattern so as to be the average value of the sizes of the plurality of patterns. The second operation means can control the size of each pattern so as to be the central value of the sizes of the plurality of patterns. The third operation means can control the size of each pattern so as to be a result of weighting the size of a desired pattern of the plurality of patterns.

The semiconductor manufacturing system of the present invention preferably includes pattern selection means for selecting a desired pattern among a plurality of patterns when the plurality of patterns are formed.

Thus, the optimum exposure value can be calculated by paying attention only to an important pattern, for example. Furthermore, the optimum exposure value can be calculated by paying attention only to a pattern at a prescribed position.

The pattern may be a developed pattern (pattern of a photosensitive material, for example) formed by development. In this case, the size comparison means compares the size of the developed pattern and a target value to calculate a size difference.

By using the size of the developed pattern as described above, the optimum exposure value can be calculated at an earlier stage as compared with a case where an etched pattern, described below, is used.

Meanwhile, the pattern may be an etched pattern formed by etching. In this case, the size comparison means compares the size of the etched pattern and a target value to calculate a size difference. It is noted that the etched pattern includes a pattern which is formed by etching a conductive layer, an insulation layer or the like using a developed pattern, for example, as a mask.

By using the pattern size after etching as described above, fluctuations in the etching manner can be addressed.

The semiconductor manufacturing system of the present invention preferably includes data storage means for storing the exposure value, the pattern size, the size difference and the optimum exposure value.

Thus, past data can be effectively utilized if necessary, and the optimum exposure value can be calculated easily. Even when a new pattern is to be formed, the optimum exposure value can be determined based on the above described data.

A semiconductor device manufacturing method of the present invention includes the steps of applying a photosensitive material, exposing the photosensitive material by an exposure device, detecting the exposure value of the exposure device during the exposing step, developing the photosensitive material, detecting the size of a pattern formed after development, comparing the detected size of the pattern and a target value to calculate a size difference, calculating an optimum exposure value by using the size difference and the exposure value, and controlling the exposure value of the exposure device so as to be the optimum exposure value.

By detecting the exposure value of the exposure device and comparing the size of the pattern formed after development and the target value to calculate the size difference as described above, the optimum exposure value can be automatically calculated by using these values. By controlling the exposure value of the exposure device so as to be the optimum exposure value calculated as described above, exposure at the optimum exposure value can be performed at an early stage even if change in the underlying layer, fluctuation in the exposure device or the like is caused.

Similarly to the case of the above described semiconductor manufacturing system, the optimum exposure value may be calculated by adding a product of a conversion coefficient for the pattern by the size difference to the exposure value. When a plurality of patterns are formed, the product value of the conversion coefficient by the size difference may be an average value of the product values for the patterns, a central value of the product values for the patterns when the products are arranged in order of magnitude, or a value which is obtained by multiplying the product values for the patterns by coefficients according to the patterns, adding them together and dividing the result by a sum of the coefficients. Thus, similar effects to the case of the semiconductor manufacturing system can be expected.

When a plurality of patterns are formed, the semiconductor device manufacturing method may include the step of selecting a desired pattern among the plurality of patterns. In this case, the size difference is calculated for the selected pattern and the optimum exposure value is calculated using the size difference. Thus, the optimum exposure value for an important pattern, for example, can be calculated.

When the pattern is a developed pattern formed by development, the pattern size detection step includes the step of comparing the size of the developed pattern and a target value to calculate a size difference. When the pattern is an etched pattern formed by etching, the pattern size detection step includes the step of comparing the size of the etched pattern and a target value to calculate a size difference. In this case, similar effects to the case of the above described semiconductor manufacturing system can also be expected.

A semiconductor device of the present invention includes a portion which is formed by exposing a photosensitive material at an optimum exposure value calculated by using a size difference between the size of a pattern formed after photolithography and a target value as well as exposure value of an exposure device during photolithography, developing the photosensitive material after exposure, and performing an etching process by using the developed photosensitive material.

Since the etching process is performed by using a pattern (pattern of a photosensitive material, for example) which is formed by exposure at the optimum exposure value as described above, the pattern (pattern of a conductive layer or an insulation layer, for example) formed by the etching process can have a size very close to a design value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described with reference to FIGS. 1 to 8.

First Embodiment

Figure 1:
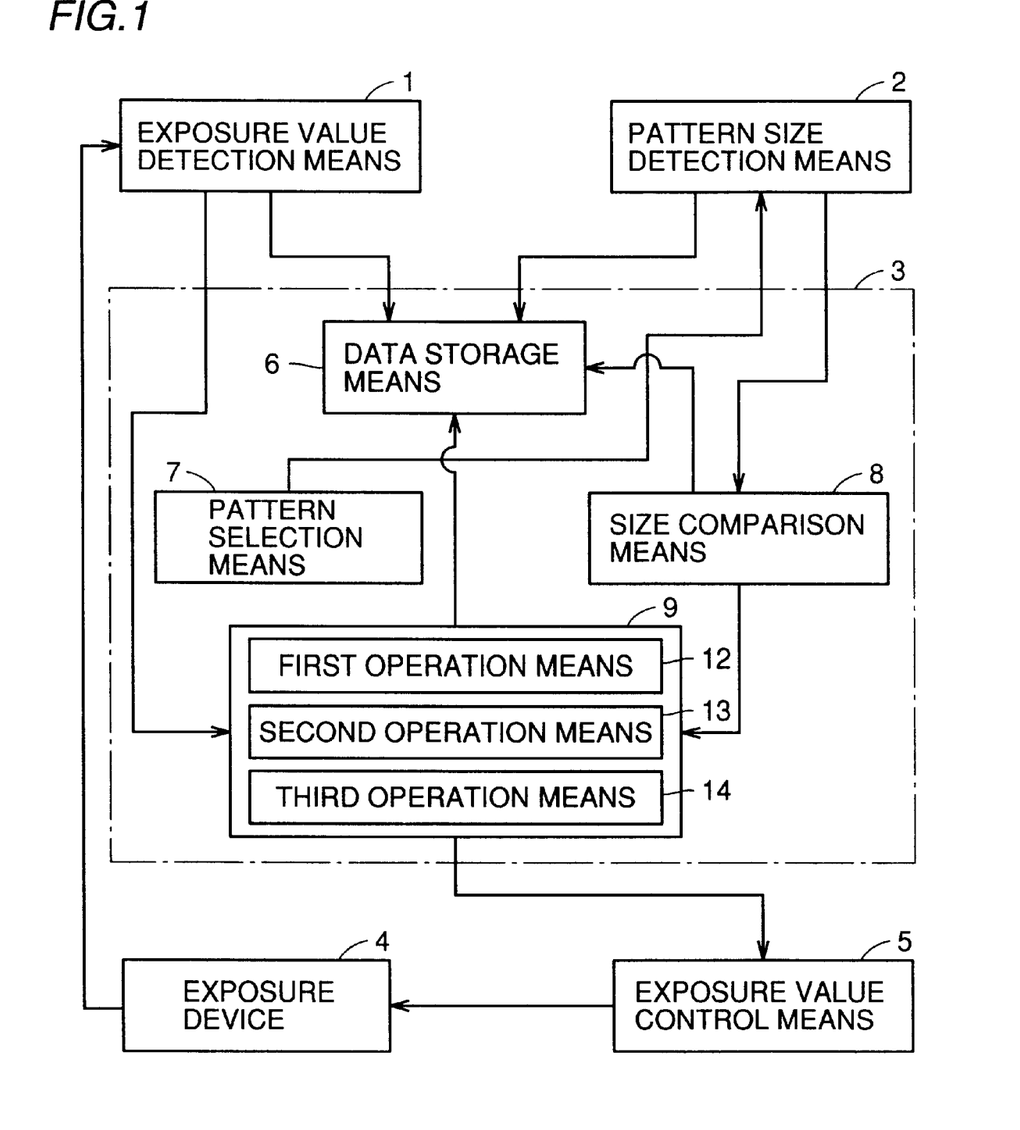
FIG. 1 is a schematic structure of a semiconductor manufacturing system of the present invention.

FIG. 1 is a schematic structure of a semiconductor manufacturing system according to the present invention.

As shown in FIG. 1, the semiconductor manufacturing system according to the present invention includes exposure value detection means 1, pattern size detection means 2, a host computer 3, an exposure device 4, and exposure value control means 5.

Exposure value detection means 1 detects the exposure value of exposure device 4. Pattern size detection means 2 detects the size of a pattern formed after photolithography. The pattern includes both of a pattern of a photosensitive material such as a photoresist and a pattern such as a conductive layer and an insulation layer which is formed by performing an etching process using a photosensitive material pattern as a mask. Exposure value control means 5 controls the exposure value so that the exposure value of exposure device 4 is an optimum exposure value.

Exposure value detection means 1 can detect the exposure value by detecting exposure time or illumination intensity, for example. Furthermore, exposure value control means 5 can control the exposure value by adjusting exposure time or illumination intensity, for example.

As shown in FIG. 1, host computer 3 has data storage means 6, pattern selection means 7, size comparison means 8 and optimum exposure value calculation means 9.

Data storage means 6 stores data such as an exposure value detected by exposure value detection means 1, a size detected by pattern size detection means 2, a size difference calculated by size comparison means 8 and an optimum exposure value calculated by optimum exposure value calculation means 9. Thus, past data can be effectively utilized if necessary and an optimum exposure value can be calculated easily. Even when a new pattern is to be formed, an optimum exposure value can be determined based on the above described data.

Pattern selection means 7 selects a desired pattern among a plurality of patterns when the plurality of patterns are formed. By providing pattern selection means 7, the optimum exposure value can be calculated by paying attention only to an important pattern, for example. In addition, the optimum exposure value can be calculated by paying attention only to a pattern at a prescribed position.

Size comparison means 7 compares an actual pattern size detected by pattern size detection means 2 and a target value for the pattern size to calculate a size difference. Therefore, the size difference may be a positive or negative value.

When the pattern is a developed pattern, (pattern of a photosensitive material, for example) formed by development, size comparison means 8 compares the size of the developed pattern and a target value to calculate a size difference. Thus, an optimum exposure value can be calculated at an earlier stage as compared with an etched pattern, described below, is used.

Meanwhile, when the pattern is an etched pattern (pattern of a conductive layer, an insulation layer or the like) formed by etching, size comparison means 8 compares the size of the etched pattern and a target value to calculate a size difference. By thus using the pattern size after etching, fluctuations in the etching state can also be addressed.

Optimum exposure value calculation means 9 calculates an optimum exposure value by using the size difference and the exposure value. The optimum exposure value can be calculated by adding a product of a conversion coefficient for a pattern, for example, by the size difference to an actual exposure value.

The conversion coefficient can be found for each pattern based on a correlation of the size difference with a difference between the optimum exposure value and the actual exposure value. By multiplying the conversion coefficient by the size difference, the difference between the actual exposure value and the optimum exposure value can be obtained. By adding the difference to the actual exposure value, the optimum exposure value can be calculated.

The exposure value of exposure device 4 is controlled by exposure value control means 5 so as to be the optimum exposure value calculated as described above. Thus, exposure at the optimum exposure value can be performed at an early stage and in a simple manner even if change in the underlying layer, fluctuation in the exposure device or the like is caused. Even if the size of a pattern formed after photolithography deviates from a target value, the pattern size can be made closer to the target value at an early stage.

When a plurality of patterns are formed, optimum exposure value calculation means 9 may calculate a product of a conversion coefficient by a size difference for each pattern. In this case, optimum exposure value calculation means 9 has at least one operation means selected from the group of first operation means 12 for finding an average value of the product values for the patterns, second operation means 13 for selecting a central value of the product values for the patterns when the products are arranged in order of magnitude, and third operation means 13 for multiplying the product values for the patterns by coefficients according to the patterns, adding them together and dividing the result by a sum of the coefficients.

First operation means 12 can control the size of each pattern so as to be an average value of the sizes of the plurality of patterns. Second operation means 13 can control the size of each pattern so as to be a central value among the sizes of the plurality of patterns. Third operation means 14 can control the size of each pattern so as to be a result value of weighting the size of a desired pattern among the plurality of patterns.

Second Embodiment

Figure 2:
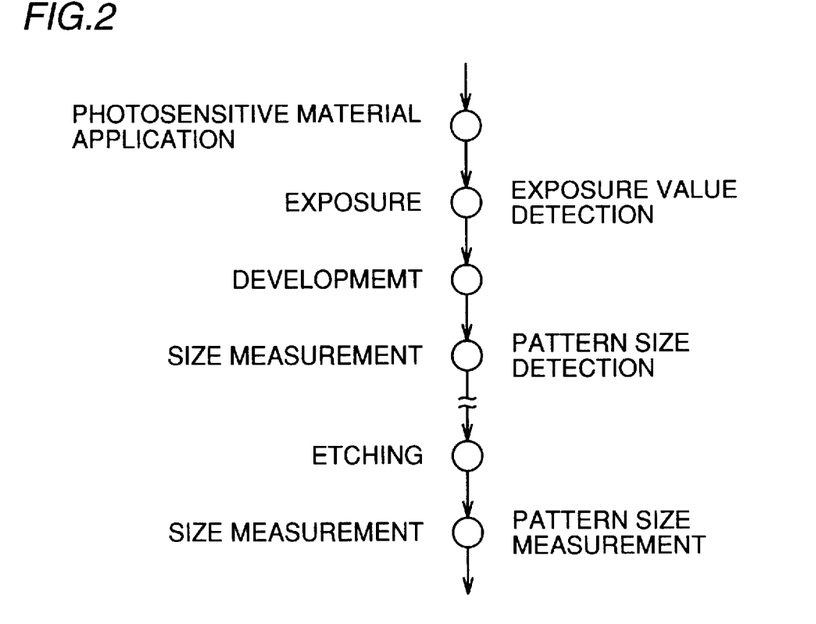
FIG. 2 is a process chart for describing a semiconductor device manufacturing method of the present invention.
Figure 3:
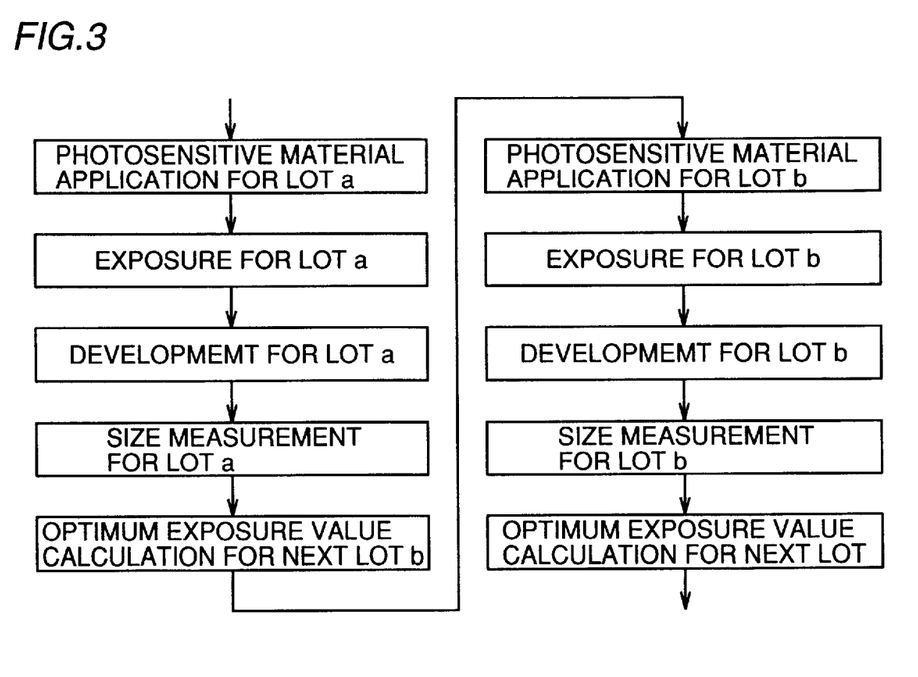
FIG. 3 is a flow chart of the semiconductor device manufacturing method of the invention.

In the following, a semiconductor device manufacturing method according to the present invention will be described with reference to FIGS. 2 and 3. FIG. 2 shows each process in the semiconductor device manufacturing method according to the present invention. FIG. 3 is a flow chart of the semiconductor device manufacturing method according to the present invention.

Referring to FIGS. 2 and 3, a photosensitive material such as a photoresist is first applied on a wafer of a lot a and this photosensitive material is exposed by exposure device 4. At this time, the exposure value of exposure device 4 during exposure is detected by exposure value detection means 1.

Thereafter, the photosensitive material is developed and then the size of a pattern formed after development is detected by pattern size detection means 2. The pattern size may be detected before or after etching. If the pattern size is detected before etching, the pattern of a resist pattern, for example, is detected. If the pattern size is detected after etching, the size of an interconnection pattern or a contact hole, for example, is detected.

Thereafter, size comparison means 8 compares the detected size of the pattern and a target value to calculate a size difference. By using the size difference and the exposure value, optimum exposure value calculation means 9 calculate an optimum exposure value for a lot b as the next lot.

Here, one example of the calculation method of optimum exposure value Ep will be described. Assume that the exposure value during exposure is E, the conversion coefficient of a pattern is K and the size difference is D, then optimum exposure value Ep is calculated by the following expression (1).

$$Ep = E + K \times D \qquad (1)$$

The exposure value (exposure time, for example) of exposure device 4 is controlled by exposure value control means 5 so as to be the optimum exposure value calculated by the expression (1). After exposing lot b at the optimum exposure value, development and size measurement are performed similarly to the above case.

As described above, past data is used to calculate an optimum exposure value and the optimum exposure value is fed back as an exposure value for a lot to be processed next. Therefore, the lot to be processed next can be exposed at the optimum exposure value which is calculated by taking into account change in the underlying layer and fluctuation in the exposure device. The series of operations as described above are performed for each lot and each process.

Third Embodiment

Figure 4:
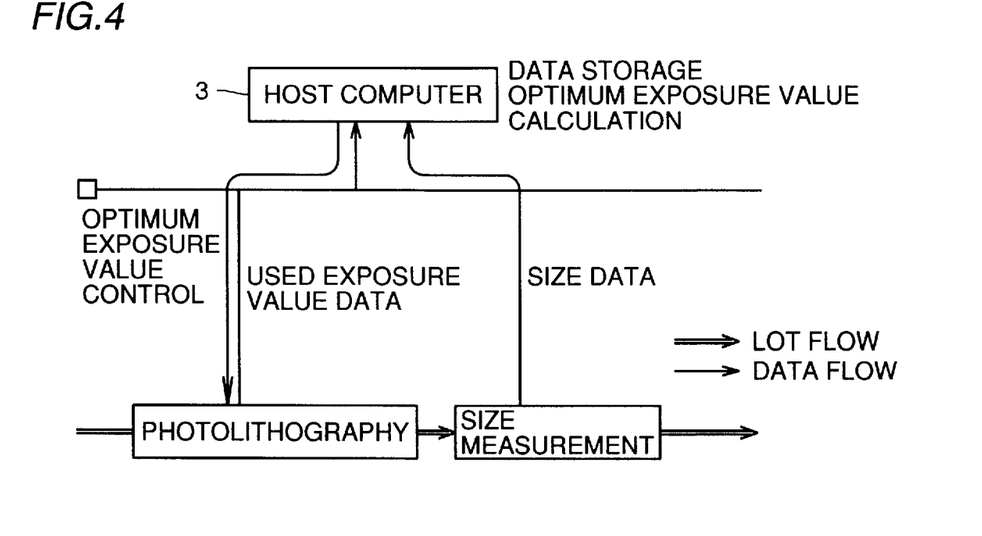
FIG. 4 is a conceptional diagram when the semiconductor device manufacturing method of the present invention is automatically controlled.
Figure 5:
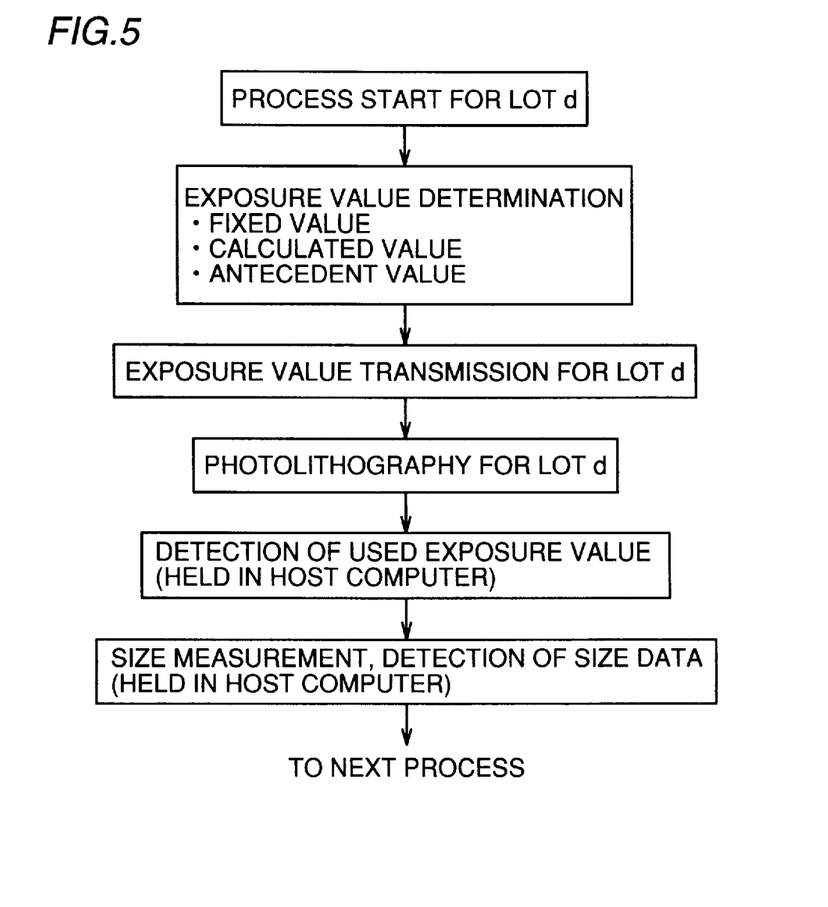
FIG. 5 is a flow chart when the semiconductor device manufacturing method of the present invention is automatically controlled.

In the following, a system which automatically performs the above described method will be described with reference to FIGS. 4 and 5. FIG. 4 is a conceptual diagram of automatic control according to the present invention. FIG. 5 is a flow chart of the automatic control.

As shown in FIG. 4, data on a used exposure value during photolithography in the above described method is input to host computer 3, and size data in size measurement performed after photolithography is input to host computer 3. In host computer 3, the used exposure value data and the size data are used to calculate an optimum exposure value by the above described method.

The optimum exposure value data is input to the exposure value control means from host computer 3 to automatically control the exposure value of an exposure device.

In the following, an operation of the above described system will be described in more detail with reference to FIG. 5. Here, assume that lots a, b, c have been processed in this order and a lot d is going to be processed. Host computer 3 stores the exposure value data, the size data, the size difference data and the optimum exposure value data of lots a to c.

As shown in FIG. 5, the exposure value is determined first. If a fixed value is registered as a value to be given priority in host computer 3, the value is used. If this value is not registered, an optimum exposure value is calculated from past data of lots a, b, c (calculated value). If past data does not exist, a fixed value is newly registered as an antecedent value. The priority of values is in the order of the priority value, the calculated value and the antecedent value.

On the assumption that a fixed value is not registered, one example of the method of calculating the optimum exposure value for lot d will be described. If the optimum exposure value for each of lots a, b, c is Ep1, Ep2, Ep3, optimum exposure value Ep4 for lot d can be calculated by the following expression (2).

$$Ep4 = (Ep1 + Ep2 + Ep3)/3 \quad (2)$$

Thus, an average value of the optimum exposure values of past lots may be adopted as an optimum exposure value for a lot to be processed next.

The optimum exposure value automatically calculated according to the above expression is automatically transmitted from host computer 3 to exposure value control means 5, and photolithography for lot d is performed at this exposure value. At this time, the exposure value for lot d is detected and stored in host computer 3. After photolithography, size measurement is performed and size data is stored in host computer 3. Thereafter, lot d is shifted to the next process.

Fourth Embodiment

In the following, a semiconductor device according to the present invention will be described. The semiconductor device according to the present invention is manufactured by the above described method.

In short, the semiconductor device includes a pattern which is formed by exposing a photosensitive material at an optimum exposure value that is calculated by using a size difference between the size of a pattern formed after photolithography and a target value as well as the exposure value of an exposure device during photolithography, developing the photosensitive material after exposure, and carrying out an etching process using the developed photosensitive material.

By performing the etching process using a pattern formed by exposure at an optimum exposure value, a pattern having an almost initially designed size can be formed. Because of provision of such a pattern, a semiconductor device with high performance and reliability can be provided.

In the following, a specific example of the optimum exposure value calculation method according to the present invention will be described with reference to FIGS. 6 to 8. The above described semiconductor device includes a pattern (an interconnection or a hole pattern, for example) having a size close to a set value denoted by dash lines in FIG. 7.

Fifth Embodiment

Figure 6:
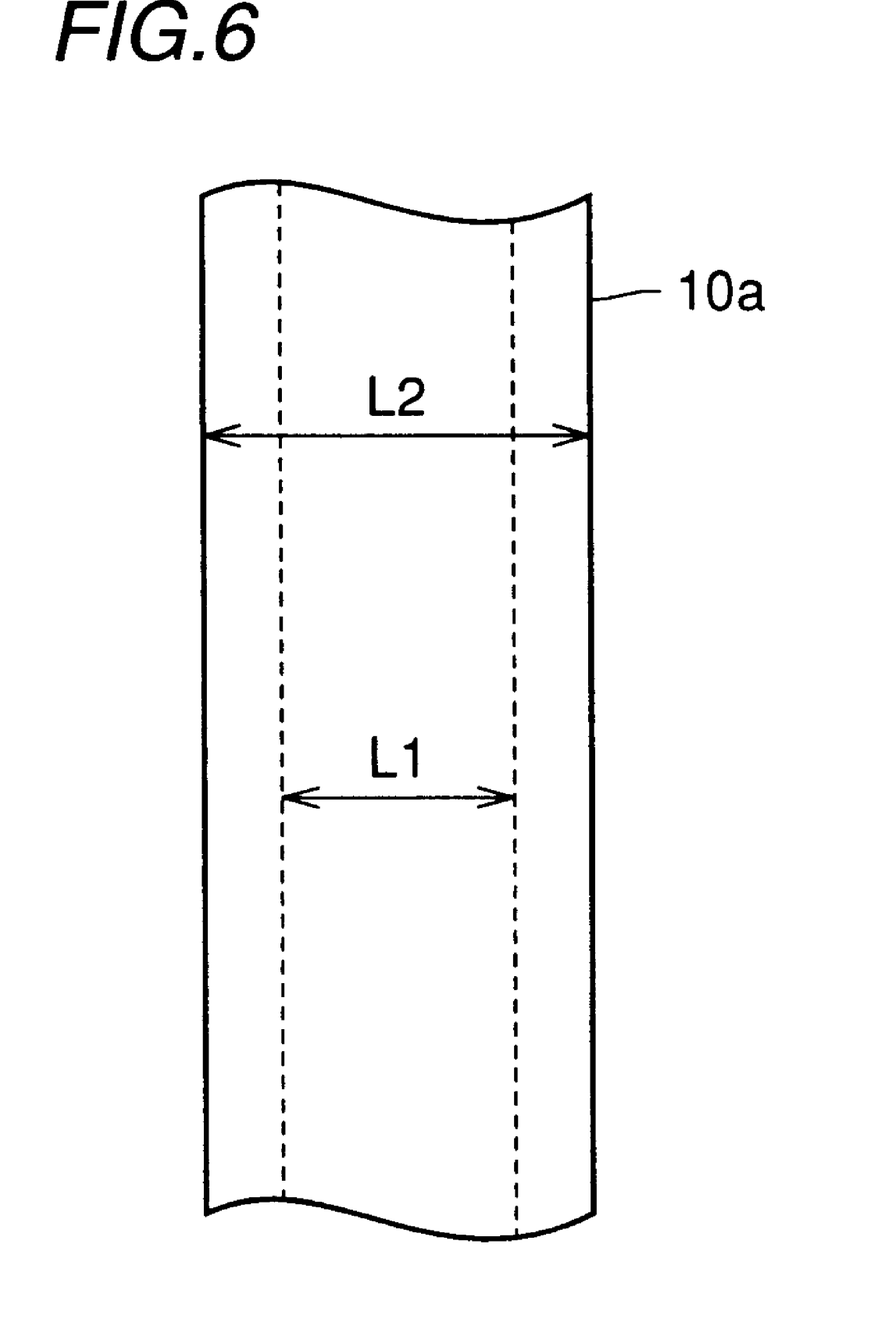
FIG. 6 is a plan view of one example of patterns which can be formed by the present invention.

FIG. 6 is a plan view of a photolithography pattern. In the fifth embodiment, formation of a pattern 10a of a photosensitive material such as a resist will be described.

In FIG. 6, L1 is a target value for the size of pattern 10a while L2 is a measured value of the size of pattern 10a. In this case, a size difference between sizes L1 and L2 is calculated, an exposure value during photolithography for forming pattern 10a is detected, and an optimum exposure value is calculated from these values by the above described method.

Specifically, if the exposure value during exposure is E and the conversion coefficient for the pattern is K, optimum exposure value Ep is calculated by the following expression (3).

$$Ep = E + K \times (L2 - L1) \quad (3)$$

Photolithography for the next lot is performed at the optimum exposure value calculated by the expression (3) to form a pattern. It is considered as a result that an ideal pattern having a size close to size L1 of the pattern denoted by the dash lines in FIG. 6 can be formed.

Sixth Embodiment

Figure 7A:
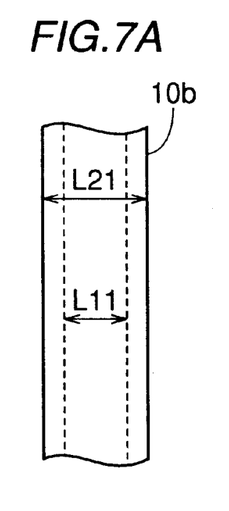
FIGS. 7A to 7C are plan views showing various pattern examples which can be formed by the present invention.
Figure 7B:
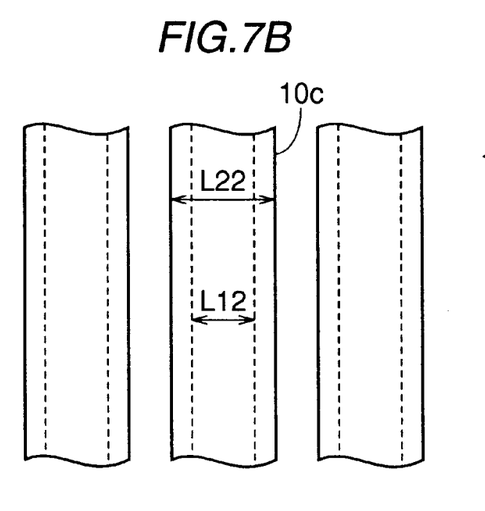
Figure 7C:
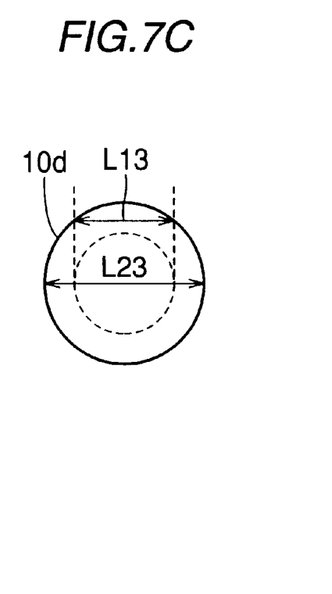

FIGS. 7A to 7C are plan views of various patterns transferred on a wafer. Specifically, shape examples such as an interconnection pattern and a hole pattern are illustrated.

Since the semiconductor manufacturing system according to the present invention has pattern selection means 7 as shown in FIG. 1, it can select a pattern to be used for calculation during the optimum exposure value calculation process. If three types of patterns 10b to 10d shown in FIGS. 7A to 7C are to be formed on a wafer, for example, an optimum exposure value can be calculated based on pattern 10b or all patterns 10b to 10d. In other words, a pattern which is to be a target can be selected.

Here, a method of calculating an optimum exposure value based on pattern 10b will be described. If the exposure value for pattern 10b during exposure is E, the conversion coefficient for the pattern is K, the target value L11 and the actual size of pattern 10b is L21, optimum exposure value Ep is calculated by the following expression (4).

$$Ep = E + K \times (L21 - L11) \quad (4)$$

The next lot is exposed at the optimum exposure value calculated by the expression (4) to form resist patterns. By performing an etching process using the resist patterns, the size of each pattern 10b to 10d can be made closer to target value L11.

In the following, a method of calculating an optimum exposure value based on all patterns 10b to 10d will be described. If the exposure value for patterns 10b to 10d during exposure is E, the conversion coefficients for patterns 10b to 10d are K1 to K2, K3, the target values are L11, L12, L13 and the actual sizes are L21, L22, L23, and then optimum exposure value Ep is calculated by first operation means 12 in FIG. 1 according to the following expression (5).

$$Ep=E+(K1\times(L21-L11)+K2\times(L22-L12)+K3\times(L23-L13))/3 \quad (5)$$

The next lot is exposed at the optimum exposure value calculated by the expression (5) to form resist patterns. By performing an etching process using the resist patterns, the size of each pattern 10b to 10d can be made closer to an average value of target values L11 to L13.

Although the three patterns are described in the sixth embodiment, the number of patterns is arbitrary. The number of patterns to be selected is arbitrarily changed.

Seventh Embodiment

In the sixth embodiment above, each pattern 10b to 10d can be weighted. If patterns 10b to 10d are weighted in the manner of l:m:n, for example, optimum exposure value Ep is calculated by third operation means 14 in FIG. 1 according to the following expression (6).

$$Ep=E+1/(1+m+n)\times(1\times K1\times(L21-L11)+m\times K2\times(L22-L12)+n\times K3\times(L23-L13)) \quad (6)$$

Thus, the optimum exposure value can be calculated by weighting desired patterns.

Eighth Embodiment

Figure 8:
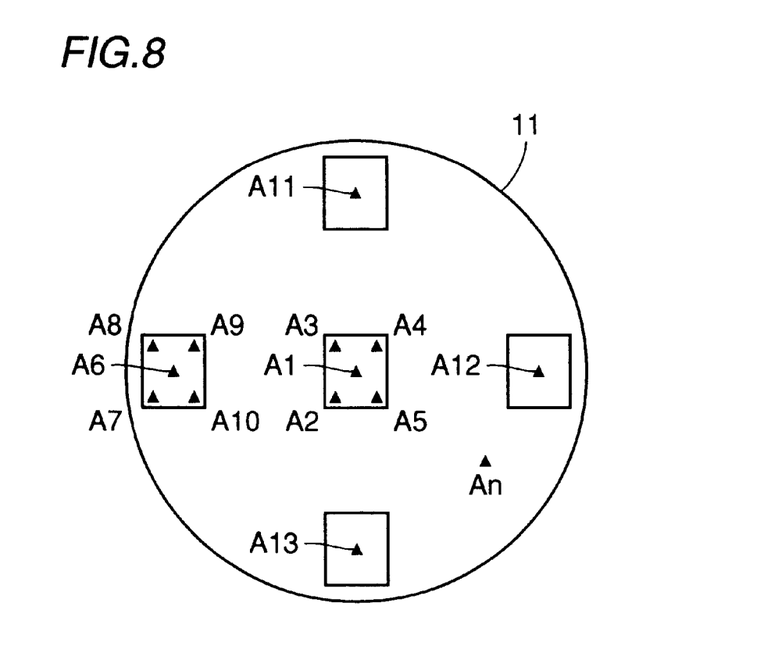
FIG. 8 is a plan view showing size measurement points on a wafer.

FIG. 8 shows size measurement points A1 to An on a wafer 11. The sizes of a pattern at points A1 to An shown in FIG. 8 are measured, and an optimum exposure value is calculated based on the sizes and the exposure value.

Specifically, if the exposure value at points A1 to An during exposure is E, the pattern conversion coefficients at points A1 to An are K1 to Kn, the target values for the patterns sizes are L11 to L1n, the actual sizes of the patterns are L21 to L2n, then optimum exposure value Ep is calculated by first operation means 12 according to the following expression (7)

$$Ep=E+(K1\times(L21-L11)+K2\times(L22-L12)+\ldots Kn\times(L2n-L1n))/n \quad (7)$$

It is noted that the optimum exposure value may be calculated by selecting one point of points Al to An. In addition, the optimum exposure value may be calculated for each square region (shot region, for example) in FIG. 8.

Instead of using an average value as a product of a conversion coefficient by a difference between the size of each pattern and a target value, a central value of the product values when the products are arranged in order of magnitude may be employed by using second operation means 13.

As described above, according to the semiconductor manufacturing system and the semiconductor device manufacturing method of the present invention, the optimum exposure value can be used for exposure even if change in the underlying layer, fluctuation in the exposure device or the like is caused. It is therefore possible to suppress deviation of the size of a pattern formed after photolithography from a target value.

According to the semiconductor device of the present invention, a pattern having a size identical or very close to a design value can be stably formed. Therefore, not only is the yield improved but a semiconductor device with high performance and reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor manufacturing system, comprising:
   exposure value detection means for detecting an exposure value of an exposure device;
   pattern size detection means for detecting a size of a pattern formed after photolithography;
   size comparison means for comparing the size of the pattern detected by said pattern size detection means and a target value to calculate a size difference;
   optimum exposure value calculation means for calculating an optimum exposure value by using said size difference and said exposure value; and
   exposure value control means for controlling the exposure value of said exposure device so as to be the optimum exposure value calculated by said optimum exposure value calculation means.

2. The semiconductor manufacturing system according to claim 1, wherein said optimum exposure value calculation means calculates said optimum exposure value by adding a product of a conversion coefficient for said pattern by said size difference to said exposure value.

3. The semiconductor manufacturing system according to claim 2, wherein a plurality of said patterns are formed, and said optimum exposure value calculation means calculates a product of said conversion coefficient by said size difference for each of said patterns, and has at least one operation means selected from a group of first operation means for finding an average value of said products for said patterns, second operation means for selecting a central value of said products for said patterns when the products are arranged in order of magnitude, and third operation means for multiplying said products for said patterns by coefficients according to said patterns, adding them together and dividing the result by a sum of said coefficients.

4. The semiconductor manufacturing system according to claim 1, wherein a plurality of said patterns are formed, further comprising
   pattern selection means for selecting a desired one of said patterns among said plurality of patterns.

5. The semiconductor manufacturing system according to claim 1, wherein said pattern is a developed pattern formed by development, and
   said size comparison means compares a size of said developed pattern and a target value to calculate a size difference.

6. The semiconductor manufacturing system according to claim 1, wherein said pattern is an etched pattern formed by etching, and
   said size comparison means compares a size of said etched pattern and a target value to calculate a size difference.

7. The semiconductor manufacturing system according to claim 1, comprising data storage means for storing said exposure value, said pattern size, said size difference and said optimum exposure value.

* * * * *

UNITED STATES PATENT AND TRADEMARK OFFICE
CERTIFICATE OF CORRECTION

PATENT NO.     : 6,570,643 B1                                                      Page 1 of 1
DATED          : May 27, 2003
INVENTOR(S)    : Yuki Miyamoto et al.

It is certified that error appears in the above-identified patent and that said Letters Patent is hereby corrected as shown below:

<u>Title page,</u>
Item [56], References Cited, FOREIGN PATENT DOCUMENTS, change "TW 368382" to -- TW 368682 --

Signed and Sealed this

Fourteenth Day of October, 2003

JAMES E. ROGAN
*Director of the United States Patent and Trademark Office*